(12) United States Patent
Cavallotti et al.

(10) Patent No.: US 6,635,123 B2
(45) Date of Patent: Oct. 21, 2003

(54) COPPER PRESERVATIVE TREATMENT

(75) Inventors: Pletro Luigi Cavallotti, Milan (IT); Fiavio Cereda, Milan (IT); Vittorio Sirtori, Milan (IT); Franco Zambon, Milan (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/838,876

(22) Filed: Apr. 23, 2001

(65) Prior Publication Data

US 2001/0030223 A1 Oct. 18, 2001

Related U.S. Application Data

(63) Continuation of application No. 09/137,072, filed on Aug. 20, 1998, now abandoned.

(30) Foreign Application Priority Data

Oct. 28, 1997 (GB) .............................................. 9722692

(51) Int. Cl.⁷ .............................................. C23C 22/00
(52) U.S. Cl. ........................ 148/269; 148/274; 427/96; 428/643; 106/14.16; 106/14.41
(58) Field of Search ................................ 148/269, 274; 427/96; 428/643; 106/14.16, 14.41

(56) References Cited

U.S. PATENT DOCUMENTS

| 3,803,047 A | | 4/1974 | Hwa |
| 4,343,660 A | * | 8/1982 | Martin ........................ 427/269 |
| 5,173,130 A | * | 12/1992 | Kinoshita et al. ............ 148/268 |
| 5,783,059 A | * | 7/1998 | Cavallotti et al. ........... 205/226 |

FOREIGN PATENT DOCUMENTS

| EP | 0 428 260 A | * | 5/1991 |
| GB | 1390843 | * | 4/1975 |
| JP | 53149836 | | 12/1978 |

* cited by examiner

*Primary Examiner*—John Sheehan
*Assistant Examiner*—Andrew L. Oltmans
(74) *Attorney, Agent, or Firm*—Connolly Bove Lodge & Hutz LLP; Arthur J. Samodovitz

(57) ABSTRACT

A method of pretreating a copper surface for protecting the surface from oxidation, by immersing the surface in a solution containing organic solderabilty preservatives, such as BenzoTriAzole, with the addition of a zinc salt. The method is particularly useful in the manufacturing of electronic Printed Circuit Boards for protecting the copper surfaces during the solder processes when the PCB undergoes high temperature. The addition of the zinc salts also gives the additional advantage of increasing the solderabilty properties of the copper surface (i.e. wettability and adhesion).

15 Claims, No Drawings

COPPER PRESERVATIVE TREATMENT

This application is a continuation of U.S. patent application Ser. No. 09/137,072, filed Aug. 20, 1998 now abandoned.

TECHNICAL FIELD

The present invention relates to a method for protecting a copper surface, particularly in the manufacturing of electronic circuit boards.

BACKGROUND OF THE INVENTION

The use of tin base solder alloys is common in electronic applications, particularly in the manufacturing of printed circuit boards (PCB), for assembly of components onto the boards, providing mechanical and electrical connection. These tin solder alloys are useful in joining integrated circuit chips to chip carriers and substrates, joining chip carriers to substrates, and joining circuitization lands and pads in multilayer printed circuit boards.

In the manufacturing of a microelectronic package, it is common practice to attach a component onto a printed circuit board or the like, for example by surface mounting utilizing a solder connection. For this purpose, the board features a circuit trace including a pad that constitutes a first surface for the connection; similarly, the component includes a second surface, for example a contact.

The interconnection method comprises the steps of applying a solder alloy on the Cu substrate, typically onto the pad included in the printed circuit board.

The electronic components to be joined with the board are then brought into contact with the solder layer. The solder alloy is heated to cause the solder alloy to melt and reflow; heating may be by vapor phase reflow, infrared reflow, laser reflow, or the like. Upon cooling, the solder alloy resolidifies and bonds to the surfaces to complete the connection. The solder connection not only physically attaches the component to the board, but also electrically connects the trace on the board and the contact of the component to conduct electrical current to and from the component for processing.

The oxidation of a copper surface exposed to the air is a well known problem, not only in the manufacturing of electronic modules. The oxidation of copper pads of a PCB affects the solderability of the copper surface with the tin based alloy and this can cause problems in the assembly of the electronic module, particularly when the PCB is exposed to air for a prolonged period before being processed. For this reason the PCB is usually treated with chemical solutions which protect the copper from oxidation.

One of the known techniques used for protecting copper surfaces from corrosion, especially in the field of electronic circuit boards, is the Organic Solderability Preservative coating as described for example in "Corrosion Protection of Copper Using Organic Solderability Preservatives" by I. Artaki et al. Circuit World Vol., 19 No. 3, 1993, pages 40–45. These organic coatings are usually based on azole or its derivatives. Azoles react with metallic copper forming a film which helps to inhibit copper oxidation without compromising the solderability of the copper surface. U.S. Pat. No. 3,295,917 discloses inhibiting copper corrosion by coating with benzotriazole. U.S. Pat. No. 3,933,531 discloses a preservative treatment with 2-alkyl imidazoles. U.S. Pat. No. 4,373,656 discloses a method for preserving a copper surface by immersing in imidazole.

As mentioned above, it is known to bathe the PCB in a solution containing BenzoTriAzole (BTA). A commercially available BTA based product is, for example, Entek56 produced by Enthone-Omi Inc.

However the prior art treatments are not always satisfactory, especially during the soldering process when the PCB undergoes high temperature processing.

Therefore an improved treatment for the copper surface would be highly desirable.

It is an object of the present invention to provide a technique which alleviates the above drawbacks.

SUMMARY OF THE INVENTION

According to the present invention we provide a solution for preserving a copper surface of an electronic module, the solution containing at least one compound selected from the family of the azoles, characterized in that it further comprises a zinc salt.

Further, according to the present invention we provide a method for protecting a copper surface of an electronic module comprising the step of immersing the copper surface in a solution containing at least one compound selected from the family of the azoles, characterized in that it further comprises a zinc salt.

Also, according to the present invention, we provide a method for soldering a metallic component on a copper surface with a tin base alloy, the method comprising the step of pretreating the copper surface with a solution as described herein.

The addition of the zinc (Zn) salts in the pretreatment solution gives substantial improvements to the copper (Cu) surface characteristics. The Cu surface oxidation decreased, both during soldering and the exposure to atmosphere; the Cu surface wettability is substantially improved, even after long time at relatively high temperature; and the adhesion of the tin (Sn) solder alloy is increased.

The decrease of oxidation of the Cu surface with time and temperature could be interesting and appreciated in many other applications, in fields different from the electronics industry, e.g. the treatment of copper roofs and panels in the building industry for maintaining the original copper aspect; other possible applications cover sanitary or hydraulic uses for protecting copper pipes.

The present invention takes advantage of the fact that Zn forms a complex with BTA, in presence of Cu increasing the stability of layer adsorbed on the surface and giving to the interface the advantages described above.

DETAILED DESCRIPTION OF THE PREFERRED EMBODIMENT

According to the present invention the Zn salt is added to a treatment solution containing an organic substance for inhibiting copper oxidation (e.g. benzotriazole or benzimidazole) and adequately complexed. The pH of the solution can be varied in the range 5–8. According to a preferred embodiment a 7.5 pH has been reached by the addition of ammonia. The quantity of the components should be in the following ranges:

| | |
|---|---|
| Zn salt | 0.1–1 mol |
| BTA | 0.001–0.5 mol |
| (molar ratio) amine/zinc salt | 1–2 |
| (molar ratio) organic acid/zinc salt | 1–3 |
| pH | 5–8 |

According to a preferred embodiment the bath solution is prepared dissolving a Zn salt in water; then an amine and an organic acid are provided to complex the Zn salt and buffer the bath solution. The solution is then stabilized at 7.5 pH by the addition of ammonia. Finally BTA is added and the solution is stirred and heated. More specifically, as an example of a preferred embodiment, 45 g of zinc acetate $Zn(CH_3COO)_2 2H_2O$, is dissolved in 200 ml of water; the complexants used are 50 ml of TriEthanolAmine (TEA) and 25 ml of acetic acid $CH_3COOH$. Then the BTA is added in the quantity of 0.1 g and the volume of the solution is increased to 500 ml by addition of water. The addition of BTA can be done by directly adding 0.1 g to the solution, add the water to reach the volume of 500 ml and then stirring and heating (T=40–70° C.) until a limpid solution is obtained.

Alternatively the BTA can be previously dissolved in an alcoholic solution (5 g of BTA in 50 ml of ethanol) and then added to the above solution (1 ml of the alcoholic solution). In this way no heating is required and only a few minutes of stirring will give a limpid solution.

In order to increase the wettability of the copper surface to be treated with the above solution, a surfactant can be added. This is particularly useful for facilitating the wettability of "via holes" in a Printed Circuit Board. According to a preferred embodiment a commercially available product SANDOPAN ECO produced by CLARIANT has been used, but any other similar product can be used (e.g. TRITON DF16 produced by ROHM & HAAS).

By immersing a copper surface (e.g. a Printed Circuit Board with copper circuits) in the above described solution, Zn is deposited on the copper surface.

A copper surface treated with the preservative solution according to a preferred embodiment of the present invention has been compared with another surface treated with a prior art solution containing 0.2 g/l of BTA.

Then the copper surface specimens have been heated at 240° C. for 2 minutes and left exposed to the atmosphere at room temperature for 24 hours for simulating the actual conditions at which the PCB are exposed during the manufacturing processing (soldering cycles and storage).

We will refer to the solution according to a preferred embodiment of the present invention as ZAB (from Zn Added BTA) as opposed to simply BTA which is the prior art solution.

Laboratory tests have been performed using ESCA-XPS measurements with monochromatic Al Kalfa X-ray source (1486.67 eV); pass energy 29.35 eV, sputtering rate 2 nm/min, detector/sample angle 45.

The results obtained are as follows:

| | C | N | O | Cu | Zn |
|---|---|---|---|---|---|
| ZAB treatment: | | | | | |
| surface | 31 | 6 | 34 | 19 | 10 |
| 1.7 nm sputt. | 5 | 3 | 12 | 71 | 9 |
| 5.1 nm sputt. | 3 | 2 | 3 | 89 | 3 |
| 10 nm sputt. | 2 | 2 | — | 95 | 1 |
| BTA treatment: | | | | | |
| surface | 36 | 7 | 32 | 25 | |
| 1.7 nm sputt. | 7 | 4 | 25 | 64 | |
| 5.1 nm sputt. | 9 | 4 | 9 | 78 | |
| 10 nm sputt. | — | — | — | 100 | |

From the tables above it is clear that the ZAB treatment caused a decrease of oxidation when the copper surface has been heated and exposed to air, which is the most critical condition for a Printed Circuit Board. Looking at the percentage of Oxygen at 1.7 nm depth it is half than in the case of prior art BTA treatment; at 5.1 nm it is one third.

As mentioned above, another advantage of using the pretreatment according to the present invention is the improvement of the copper surface wettability with a tin (Sn) solder alloy. Wettability is an indication of how completely and quickly the molten solder can cover a solid surface. Wettability tests by measuring the stripping force with a wetting balance have been performed. Two copper surfaces, one treated with the BTA prior art solution, the other with the ZAB solution described above, have been immersed in a liquid eutectic Sn—Pb alloy at 215 C. and fluxed with a suitable solution (Kester 450 33% in IPA). Then they have been heated at 240° C. for 2 minutes and kept exposed to the atmosphere for 24 hours. The results were as follows:

ZAB 3.4 mN after 2.3 sec 6.9 mN after 5.1 sec
BTA 1.1 mN after 3 sec 4.7 mN after 8.5 sec The test shows, for the surface pretreated with the ZAB solution described above, according to a preferred embodiment of the present invention, a better wettability in a shorter time of immersion.

Another advantage of the pretreatment solution of the present invention is the increased adhesion of a solder alloy to the copper surface. This is particularly useful in case a Pb free alloy is to be used. Tin-lead (Sn—Pb) alloys have been used for most electronic soldering operations. These alloys have been selected because of their mechanical strength, low relative cost, electrical conductivity and excellent wetting characteristics. In addition, Sn—Pb alloys provide a low melting temperature, which is important in electronic applications because many components and printed circuit boards use materials that are easily damaged by exposure to high temperature during manufacture or assembly. However, lead has been recognized as a health hazard, being toxic for workers and for the environment; recently governments have begun to urge the electronic industry to find alternatives to lead in order to reduce electronic industry worker lead exposure and reduce the amount of lead waste going back into the environment. Lead presence in the soldering alloys is particularly critical in the case of application for manufacturing the most recent generation of C-MOS; in fact the details are so thin in this kind of board, that the emission of α particles from the emitting radioisotope present in the lead can provoke serious problems for the device. Lead-free solder alloys known in the art, however such alloys present some problems. They exhibit poor soldering and metallurgical properties, that is small peel strength and low creep resistance. Particularly, they have shown poor mechanical properties at temperatures of the type typically encountered by microelectronic packages during use.

For the above reason the increased adhesion provided by the pretreatment solution described by the present invention can be very useful particularly in the case of Pb free alloy, e.g. tin-bismuth (Sn—Bi) alloy.

Using a free wheeling rotary test fixture, the peeling strength of several different copper joints soldered with eutectic SnBi alloy has been measured. This kind of machine is well known by those skilled in the art for measuring the properties of the solder joints.

The joints were obtained by soldering at 250° C. in an industrial oven with $N_2(O_2 100$ ppm) atmosphere; Sn alloy was deposited as paste on rectangular Cu foils 25 mm wide and 50 mm long, thickness >50µ, in contact with Sn coated rectangular Cu foils of 10 mm width. The deposition was carried out on a 20×20 mM².

The machine parameters during the test run were:
sampling rate 10 points/sec
crosshead speed 5 mm/min
humidity 55%
temperature 21 C.

The peeling length was established according to the run, in the range corresponding to a constant peeling load.

The results obtained are as follows:

| Average peeling strength | | Standard deviation |
|---|---|---|
| ZAB pretreatment | 1.10 N/mm | ± 0.09 |
| BTA pretreatment | 0.87 N/mm | ± 0.66 |

What is claimed is:

1. A method for enhancing the solderability properties of a copper surface, the method comprising the steps of:
   providing a copper surface;
   providing a solution comprising:
      at least one azole in a molar concentration of from about 0.001 to about 0.5 molar,
      and a zinc salt in a molar concentration of from about 0.1 to about 1 molar;
      an organic acid;
      a complexing agent, wherein the pH of said solution is from about 5 to about 8; and
   contacting said surface with said solution.

2. The method for enhancing the solderability properties of a copper surface, according to claim 1, wherein said azole is benzotriazole.

3. The method for enhancing the solderability properties of a copper surface, according to claim 1, wherein said azole is benzimidazole.

4. The method for enhancing the solderability properties of a copper surface, according to claim 1, wherein said zinc salt is zinc acetate.

5. The method for enhancing the solderability properties of a copper surface, according to claim 1, wherein said complexing agent comprises an amine.

6. The method for enhancing the solderability properties of a copper surface, according to claim 5, wherein the molar ratio of said amine to said zinc salt is from about 1 to about 2.

7. The method for enhancing the solderability properties of a copper surface, according to claim 1, wherein the molar ratio of said organic acid to said zinc salt is from about 1 to about 3.

8. The method for enhancing the solderability properties of a copper surface, according to claim 5, wherein the molar ratio of said amine to said zinc salt is from about 1 to about 2.

9. The method for enhancing the solderability properties of a copper surface, according to claim 1, wherein said solution further comprises ammonia.

10. The method for enhancing the solderability properties of a copper surface, according to claim 1, wherein said solution further comprises a surfactant.

11. A method for enhancing the tin-based solderability properties of a copper surface, the method comprising the steps of:
    providing a copper surface;
    providing a tin-based solder;
    providing a solution comprising:
       at least one azole in a molar concentration of from about 0.001 to about 0.5 molar, a zinc salt in a molar concentration of from about 0.1 to about 1 molar,
       at least one amine wherein the molar ratio of said amine to said zinc salt is less than 3,
       at least one organic acid wherein the molar ratio of said organic acid to said zinc salt is less than 4; and
       a complexing agent, wherein the pH of said solution is from about 5 to about 8;
    contacting said surface with said solution; and
    soldering said surface with said solder.

12. The method for enhancing the solderability properties of a copper surface, according to claim 1, wherein said solder is a substantially lead-free alloy.

13. The method for enhancing the solderability properties of a copper surface, according to claim 12, wherein said substantially lead-free alloy is a tin-bismuth alloy.

14. The method for enhancing the solderability properties of a copper surface, according to claim 1, wherein said contacting comprises immersion.

15. The method for enhancing the solderability properties of a copper surface, according to claim 12, wherein pretreating comprises immersion.

* * * * *